US008610191B2

(12) United States Patent
Moon et al.

(10) Patent No.: US 8,610,191 B2
(45) Date of Patent: Dec. 17, 2013

(54) SEMICONDUCTOR DEVICES AND DYNAMIC RANDOM ACCESS MEMORY DEVICES INCLUDING BURIED GATE PATTERN WITH HIGH-K CAPPING LAYER

(75) Inventors: Joon-Seok Moon, Seoul (KR); Dong-Soo Woo, Seoul (KR); Jaerok Kahng, Seoul (KR); Jinwoo Lee, Yongin-si (KR); Keeshik Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 454 days.

(21) Appl. No.: 12/958,601

(22) Filed: Dec. 2, 2010

(65) Prior Publication Data
US 2011/0169066 A1 Jul. 14, 2011

(30) Foreign Application Priority Data

Jan. 14, 2010 (KR) ........................ 10-2010-0003526

(51) Int. Cl.
*H01L 29/78* (2006.01)
*H01L 27/108* (2006.01)
(52) U.S. Cl.
USPC .......................................... 257/306; 257/330
(58) Field of Classification Search
USPC ................ 257/306, 330, 68, 71, E29.262, 257/E27.084, E27.091, E21.409, E21.646, 257/E29.26, 296
See application file for complete search history.

(56) References Cited

U.S. PATENT DOCUMENTS

| 6,225,659 B1 * | 5/2001 | Liu .................................. 257/314 |
| 6,624,469 B1 * | 9/2003 | Harada ........................... 257/330 |
| 7,166,891 B2 * | 1/2007 | Yoshimochi ................... 257/329 |
| 7,345,342 B2 * | 3/2008 | Challa et al. ................... 257/341 |
| 7,449,354 B2 * | 11/2008 | Marchant et al. ............... 438/39 |
| 7,547,604 B2 * | 6/2009 | Tran ................................ 438/259 |
| 7,582,931 B2 * | 9/2009 | Lee et al. ........................ 257/330 |
| 2002/0130359 A1 * | 9/2002 | Okumura et al. .............. 257/330 |
| 2006/0214222 A1 * | 9/2006 | Challa et al. ................... 257/328 |
| 2006/0273388 A1 * | 12/2006 | Yamazaki ....................... 257/330 |
| 2007/0187774 A1 * | 8/2007 | Goldbach et al. .............. 257/369 |
| 2008/0191288 A1 * | 8/2008 | Kwon et al. .................... 257/383 |
| 2008/0258234 A1 * | 10/2008 | Henson et al. ................. 257/384 |
| 2008/0268588 A1 * | 10/2008 | Anderson et al. .............. 438/218 |
| 2009/0114982 A1 * | 5/2009 | Saka et al. ...................... 257/330 |

FOREIGN PATENT DOCUMENTS

| JP | 2008-098593 | 4/2008 | |
| KR | 10-0847308 | 7/2008 | |
| KR | 10-2008-0090171 | * 10/2008 | ............ H01L 21/336 |

* cited by examiner

*Primary Examiner* — Long K Tran
*Assistant Examiner* — Jordan Klein
(74) *Attorney, Agent, or Firm* — Harness, Dickey & Pierce, P.L.C.

(57) ABSTRACT

Semiconductor devices and dynamic random access memory devices including a buried gate electrode are provided, the semiconductor devices include a substrate with a gate trench, a buried gate electrode partially filling the inside of the gate trench, a capping layer pattern in the gate trench and over the buried gate electrode, source/drain regions below an upper surface of the substrate and adjacent to both sides of the buried gate electrode, and a gate insulation layer interposed between the trench and the buried gate electrode. The capping layer pattern includes a high-k material layer that directly contacts an upper surface of the buried gate electrode.

15 Claims, 13 Drawing Sheets

SEMICONDUCTOR DEVICES AND DYNAMIC RANDOM ACCESS MEMORY DEVICES INCLUDING BURIED GATE PATTERN WITH HIGH-K CAPPING LAYER

CROSS-REFERENCE TO RELATED APPLICATIONS

This U.S. non-provisional patent application claims priority under 35 U.S.C. §119 of Korean Patent Application No. 10-2010-0003526, filed on Jan. 14, 2010, the entire contents of which are hereby incorporated by reference.

BACKGROUND

1. Field

Example embodiments relate to semiconductor devices and dynamic random access memory (DRAM) devices, and more particularly, to semiconductor devices and dynamic random access memory (DRAM) devices including a buried gate pattern. Some example embodiments include a buried gate pattern with a capping layer pattern of a high-k material layer, which has a dielectric constant of more than about 10.

2. Related Art

As semiconductor devices have become highly integrated, it is hard to obtain a stable operation of a transistor. As a way of resolving short channel effects and reducing a size of a transistor, a recess channel array transistor (RCAT) was realized.

In a RCAT, a gate electrode protrudes toward (or from) the top of a semiconductor substrate. In this case, due to the protruding gate electrode, it makes processes such as contact plug formation and planarization processes more difficult. Moreover, the edge portion of a depressed channel region causes leakage current, which is generated due to a field crowding effect. Furthermore, forming the protruding gate electrode requires a high-level patterning process.

In order to resolve the above limitations, a buried channel array transistor (BCAT) is being continuously studied. In the BCAT, a gate electrode is formed buried inside a semiconductor substrate. A capping layer pattern is provided on the buried gate electrode. The upper surface of the capping layer pattern and the upper surface of the semiconductor substrate are formed at the same level (or height). That is, the buried gate electrode is provided at a lower level than the top surface of the semiconductor substrate because of the capping layer pattern. Source/drain regions are provided in the semiconductor substrate at both sides of the buried gate electrode.

Moreover, the source/drain regions are electrically connected to a bit line and a storage electrode of a capacitor, and thus their upper regions require impurity doping of a high concentration for ohmic contact. On the contrary, a channel region of the buried gate electrode is formed with a low impurity concentration for application of a metal gate electrode. In the buried gate electrode structure, if a doping concentration of the upper region is enhanced in order to reduce the resistance of the source/drain regions, junction leakage current of the source/drain regions is increased due to an increase in the electric field. Accordingly, an appropriate amount of impurity doping is required in order to form the source/drain regions. In this case, resistance is partially increased at the source/drain regions adjacent to the capping layer pattern. An increase in resistance of the source/drain regions deteriorates the current attribute of a transistor, for example, current drivability.

SUMMARY

Example embodiments provide a semiconductor device and dynamic random access memory (DRAM) including a buried gate electrode for improving current attributes and reducing leakage current.

Some example embodiments relate to semiconductor devices and dynamic random access memory (DRAM) devices, and more particularly, to semiconductor devices and dynamic random access memory (DRAM) devices including a buried gate pattern with a capping layer pattern of a high-k material layer whose dielectric constant is more than about 10.

An example embodiment of the inventive concepts provides semiconductor devices including a substrate having a gate trench, a buried gate electrode partially filling the inside of the gate trench, a capping layer pattern in the gate trench and over the buried gate electrode, source/drain regions below an upper surface of the substrate and adjacent to both sides of the buried gate electrode, and a gate insulation layer interposed between the gate trench and the buried gate electrode, wherein the capping layer pattern includes a high-k material layer that directly contacts the upper surface of the buried gate electrode.

In some example embodiments, the semiconductor devices may further include a low-k material layer stacked over the high-k material layer of the capping layer pattern.

In other example embodiments, the high-k material layer may have a dielectric constant of more than about 10 (e.g., 9 or more, 10 or more, or 11 or more), and the low-k material layer may have a dielectric constant of less than about 3 (e.g., 4 or less, 3 or less, or 2 or less).

In still other example embodiments, the high-k material layer may include zirconium oxide ($ZrO_2$), tantalum oxide ($TaO_2$), titanium oxide ($TiO_2$) or tungsten (W), and the low-k material layer may include an oxide layer.

In even other example embodiments, the semiconductor devices may further include a high concentration impurity layer in an upper region of the source/drain regions.

In yet other example embodiments, the gate insulation layer may include a high-k material layer with a dielectric constant of more than about 10 (e.g., 9 or more, 10 or more, or 11 or more).

In further example embodiments, the source/drain regions may extend from the upper surface of the substrate, and may have bottom surfaces lower than the upper surface of the gate electrode.

In still further example embodiments, the gate insulation layer may extend into the interface between the low-k material layer and the source/drain regions. That is, the gate insulation layer may be interposed between the low-k material layer and the source/drain regions.

In even further example embodiments, the gate insulation layer may include a high-k material layer with a dielectric constant of more than about 10, and may extend into the interface between the high-k material layer and the source/drain regions. That is, the gate insulation layer may be interposed between the high-k material layer and the source/drain regions.

In yet further example embodiments, the buried gate electrode may include a metal, or doped polysilicon.

In another example embodiment of the inventive concepts, dynamic random access memories (DRAMs) include a substrate, an impurity layer in the substrate, a gate trench formed within the impurity layer and dividing the impurity layer into respectively separated source/drain regions, a buried gate electrode partially filling the gate trench, a capping layer pattern in the gate trench and over the buried gate electrode, an interlayer insulation layer covering the capping layer pattern and the source/drain regions, a storage electrode over the interlayer insulation layer and electrically connected to one of the source/drain regions. The capping layer pattern includes a high-k material.

In some example embodiments, the DRAMs may further include a gate insulation layer interposed between the inner wall of the gate trench and the buried gate electrode.

In other example embodiments, the gate insulation layer may extend into an interface between the capping layer pattern and the source/drain regions. That is, the gate insulation layer may be interposed between the capping layer pattern and the source/drain regions.

In still other example embodiments, the gate insulation layer may include a high-k material layer with a dielectric constant of more than about 10.

In even other example embodiments, the high-k material may have a dielectric constant of more than about 10.

In yet other example embodiments, the capping layer pattern may include a bottom capping layer pattern and a top capping layer pattern, which are sequentially stacked, and a dielectric constant of the bottom capping layer pattern may be greater than that of the top capping layer pattern.

In further example embodiments, the bottom capping layer may include a high-k material with a dielectric constant of more than about 10, and the top capping layer pattern may include a low-k material with a dielectric constant of less than about 3.

In still further example embodiments, the interface between the capping layer pattern and the buried gate electrode may be lower than upper surfaces of the source/drain regions and higher than lower surfaces of the source/drain regions.

In even further example embodiments, the DRAMs may further include high concentration impurity layers in upper regions of the source/drain regions, wherein the high concentration impurity layers have a higher impurity concentration than the source/drain regions.

In yet further example embodiments, the interface between the capping layer pattern and the buried gate electrode may be lower than the interface between the high concentration impurity layers and the source/drain regions.

In still another example embodiment, a semiconductor device is provided. The semiconductor device may include a buried channel array transistor (BCAT) formed within a substrate wherein the BCAT includes a gate electrode, a capping layer pattern over the gate electrode, and source/drain regions adjacent to sidewalls of the gate electrode. The semiconductor device further may include a gate insulation layer interposed between the substrate and the gate electrode. At least one of the capping layer pattern and the gate insulation layer may include a material having a dielectric constant of 10 or more. A lower surface of the source/drain regions is lower than an upper surface of the gate electrode.

In other example embodiments, the capping layer pattern may include a lower layer including the material having the dielectric constant of 10 or more, and an upper layer including a material having a dielectric constant of 3 or less. The upper surface of the upper layer and upper surfaces of the source/drain regions are at the same height.

The gate insulation layer may be further interposed between the upper layer and the source/drain regions.

In yet other example embodiments, the upper surface of the capping layer pattern and upper surfaces of the source/drain regions may be at the same height. The gate insulation layer may be further interposed between the capping layer pattern and the source/drain regions.

In still other example embodiments, the capping layer pattern and the gate insulation layer may include the material having a dielectric constant of 10 or more.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
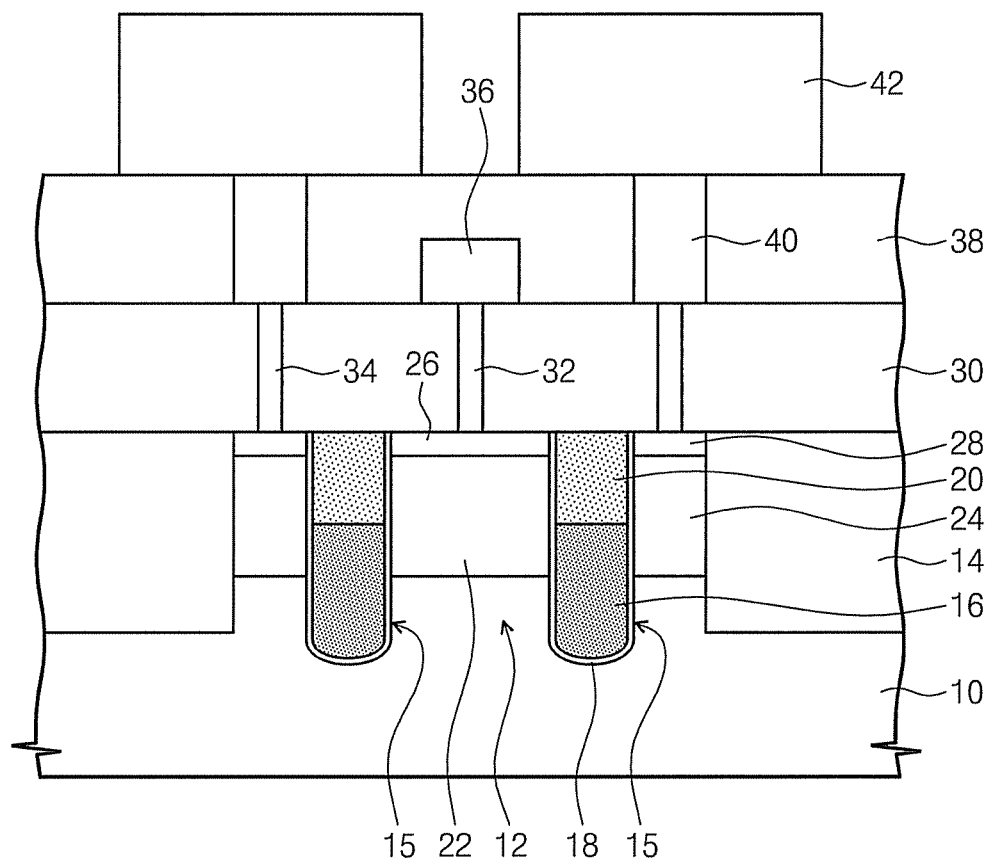
FIG. 1 is a sectional view illustrating a semiconductor device with a buried gate pattern according to an example embodiment of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term in "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to semiconductor devices and dynamic random access memory (DRAM) devices, and more particularly, to semiconductor devices and dynamic random access memory (DRAM) devices including a buried gate pattern with a capping layer pattern of a high-k material layer whose dielectric constant is more than about 10.

FIG. 1 is a sectional view illustrating a semiconductor device having a buried gate pattern according to an example embodiment of the inventive concepts.

The semiconductor device in FIG. 1 may be a dynamic random access memory (DRAM).

Referring to FIG. 1, a semiconductor substrate 10 with a device isolation region 14 for defining an active region 12 may be provided and at least one gate trench 15 may be formed in a region of the active region 12. The at least one gate trench 15 may divide the active region 12 into a plurality of active regions. For example, if the at least one gate trench 15 is single gate trench, the single gate trench divides the active region 12 into two separated active regions. If the at least one gate trench 15 is two gate trenches, the two gate trenches divides the active region 12 into three separated active regions. The gate trench 15 may be formed in the active region 12 and the device isolation region 14 simultaneously. A buried gate electrode 16 and a capping layer pattern 20 may be formed in the gate trench 15. A gate insulation layer 18 may be formed between the gate electrode 16 and the substrate 10. The buried gate electrode 16, the capping layer pattern 20, and the gate insulation layer 18 may constitute a buried gate pattern.

Source/drain regions 22 and 24 may be fanned in the substrate 10 at both sides of the gate electrode 16. Interlayer insulation layers 30 and 38 may be sequentially fanned on the substrate 10. A bit line 36 may be formed on the interlayer insulation layer 30 and a storage electrode 42 may be formed on the interlayer insulation layer 38. The bit line 36 may be electrically connected to the drain region 22 through the contact plug 32 penetrating the interlayer insulation layer 30, and the storage electrode 42 may be electrically connected to the source region 24 through the contact plugs 34 and 40 penetrating the interlayer insulation layers 30 and 38, respectively. Impurity layers 26 and 28 of high concentration for ohmic contact are formed on the upper regions of the source/drain regions 22 and 24, which contact the contact plugs 32 and 34, respectively.

Figure 2A:
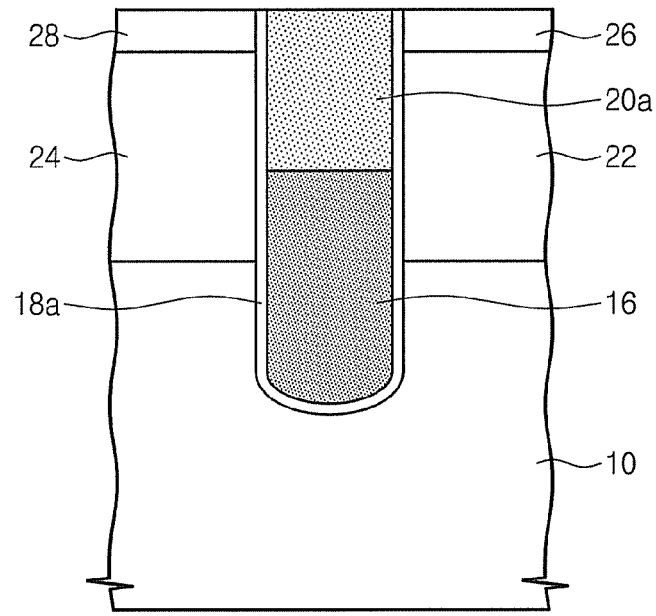
FIG. 2A through FIG. 11 are sectional views illustrating semiconductor devices with buried gate patterns according to other example embodiment of the inventive concepts.
Figure 2B:
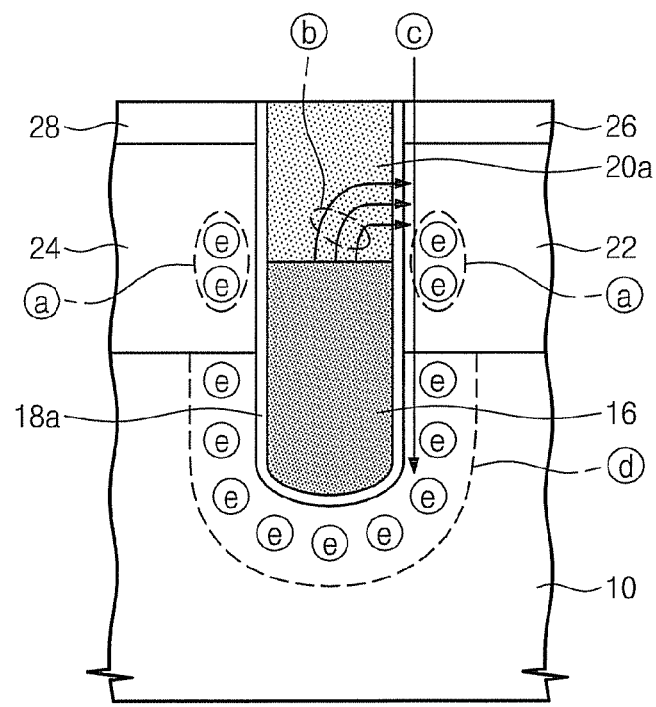

FIGS. 2A and 2B are sectional views illustrating a buried gate pattern according to a further example embodiment of the inventive concepts.

Referring to FIG. 2A, a buried gate pattern may include a buried gate electrode 16, a capping layer pattern 20a stacked on the buried gate electrode 16, and a gate insulation layer 18a. The gate insulation layer 18a may be formed between the buried gate electrode 16 and the substrate 10 and may extend into the interface between the capping layer pattern 20a and the source/drain regions 22 and 24. The capping layer pattern 20a may directly contact the upper surface of the buried gate electrode 16. The capping layer pattern 20a may include a high-k material layer. The high-k material layer may have a dielectric constant of more than 10. The high-k material layer may include a metal (e.g., $ZrO_2$, $TaO_2$, $TiO_2$, or W). The interface between the buried gate electrode 16 and the capping layer pattern 20a may be higher than a lower surface of the source/drain regions 22 and 24. Furthermore, the interface between the buried gate electrode 16 and the capping layer pattern 20a may be lower than the interface between the high concentration impurity layers 26 and 28 and the source/drain regions 22 and 24.

FIG. 2B is sectional view illustrating a theory in which a current characteristic of a metal oxide semiconductor (MOS) transistor with a buried gate pattern according to the embodiment of FIG. 2A is improved.

When an operating voltage is applied to the gate electrode 16, an inversion region ⓓ (where electrons are induced) may be formed along the interface of the substrate 10 adjacent to the gate electrode 16, where the gate insulation layer 18a is interposed between the substrate 10 and the gate electrode 16. However, as mentioned above, the source/drain regions 22 and 24 may have a lower impurity concentration than the high concentration impurity layers 26 and 28. That is, the source/drain regions 22 and 24 may have a higher electrical resistance than the high concentration impurity layers 26 and 28. Accordingly, because of the capping layer pattern 20a formed of a high-k material layer, fringing field (QV) ⓑ may be formed between the gate electrode 16 and at least one the source/drain regions 22 and 24, and as shown in a region ⓐ, the strong fringing field ⓑ may extend the inversion region ⓓ into the interface between the source/drain regions 22 and 24 and the gate insulation layer 18a. The above extension of the inversion region ⓓ may reduce an electrical resistance of the source/drain regions 22 and 24 such that current flowing into a bit line or a storage node may be increased. That is, the capping layer pattern 20a may increase current drivability of an MOS transistor with the buried gate electrode 16.

Figure 3:
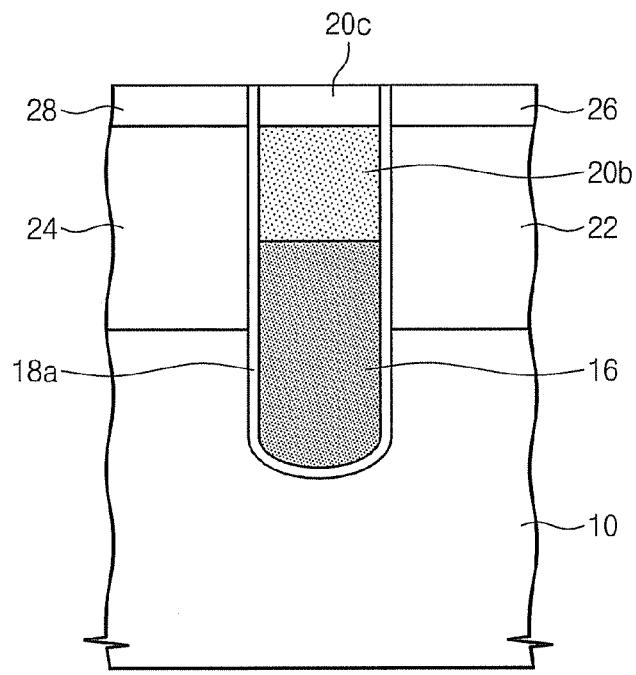

FIG. 3 is a sectional view illustrating a buried gate pattern according to a yet further example embodiment of the inventive concepts.

A difference aspect of the configuration shown in FIG. 3, compared to the embodiment of FIG. 2A, is that a capping layer pattern constituting a buried gate pattern is for of a combination layer of a low-k material layer 20c and a high-k material layer 20b. In this embodiment, the high-k material layer 20b may be stacked on the buried gate electrode 16 and the low-k material layer 20c may be stacked on the high-k material layer 20b. The low-k material layer 20c may have a dielectric constant of less than about 3. For example, the low-k material layer 20c may include an oxide layer. The high-k material layer 20b may be for of the same material layer as the capping layer pattern 20a described in the embodiment of FIGS. 2A and 2B. An electric field at the surface of the substrate 10 may be reduced by the low-k material layer 20c such that leakage current is reduced. The high-k material layer 20b may correspond to the bottom capping layer pattern, and the low-k material layer 20c may correspond to the top capping layer.

Figure 4:
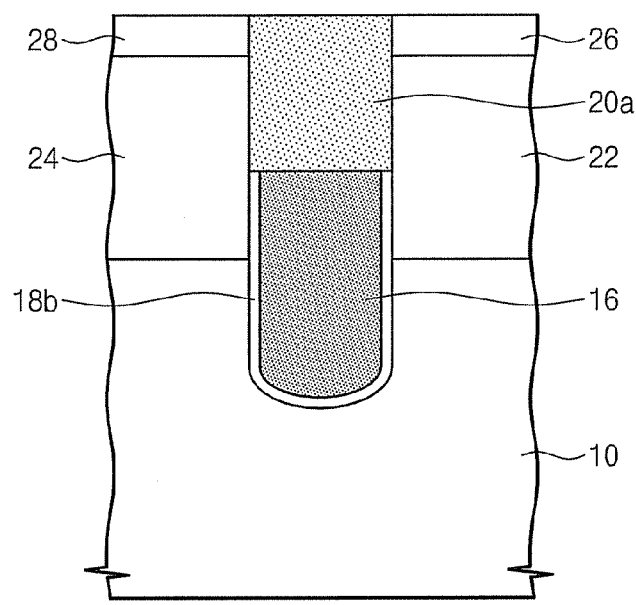

FIG. 4 is a sectional view illustrating a buried gate pattern according to a still further example embodiment of the inventive concepts.

Unlike the embodiments of FIGS. 2A and 3, a gate insulation layer 18b may not extend into the interface between the capping layer pattern 20a and the source/drain regions 22 and 24. That is, the gate insulation layer 18b may be formed to surround only the lower surface and sidewalls of the buried gate electrode 16. In addition, the capping layer pattern 20a may include a high-k material layer.

Figure 5:
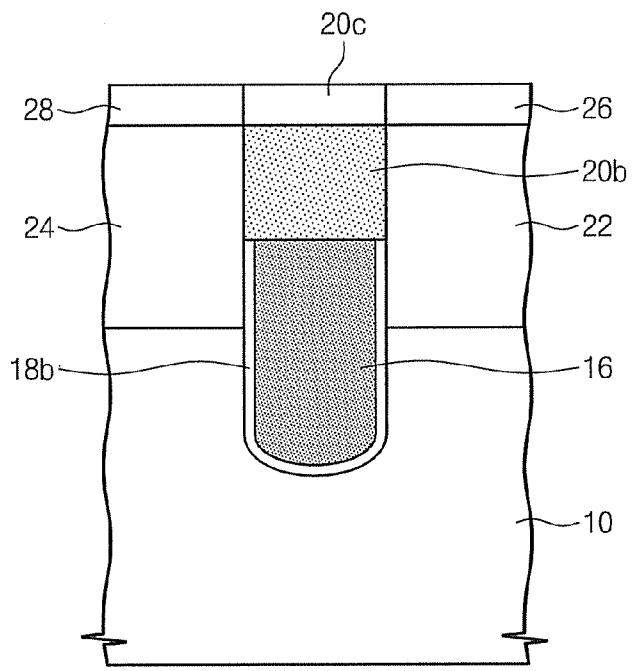

FIG. 5 is a sectional view illustrating a buried gate pattern according to a yet still further example embodiment of the inventive concepts.

Except for the structure of the capping layer pattern 20a, this embodiment may be the same as the embodiment of FIG. 4. That is, a capping layer pattern 20a of this embodiment may include a high-k material layer 20b and a low-k material layer 20c, which are sequentially stacked. As a modified embodiment, the gate insulation layer 18b may extend to the interface between the high-k material layer 20b and the substrate 10.

Figure 6:
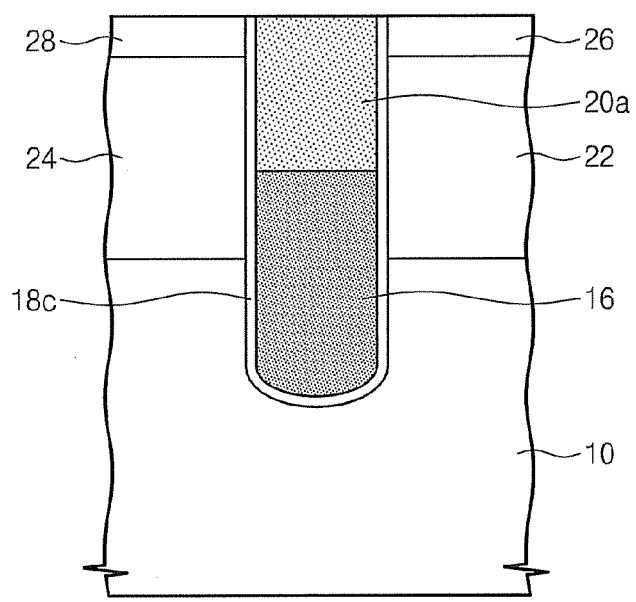

FIG. 6 is a sectional view illustrating a buried gate pattern according to an additional example embodiment of the inventive concepts.

Unlike the embodiment of FIG. 2A, a gate insulation layer 18c may include a high-k material layer according to this embodiment. The high-k material layer may have a dielectric constant of more than about 10. For example, the gate insulation layer 18c may include $ZrO_2$, $TaO_2$, or $TiO_2$. The gate insulation layer 18c may be the same material layer as the capping layer pattern 20a, or may be different from the capping layer pattern 20a. The gate insulation layer 18c may extend to the interface between the capping layer pattern 20a and the source/drain regions 22 and 24. Furthermore, the gate insulation layer 18c may extend to the interface between the capping layer pattern 20a and the high concentration impurity layers 26 and 28.

Figure 7:
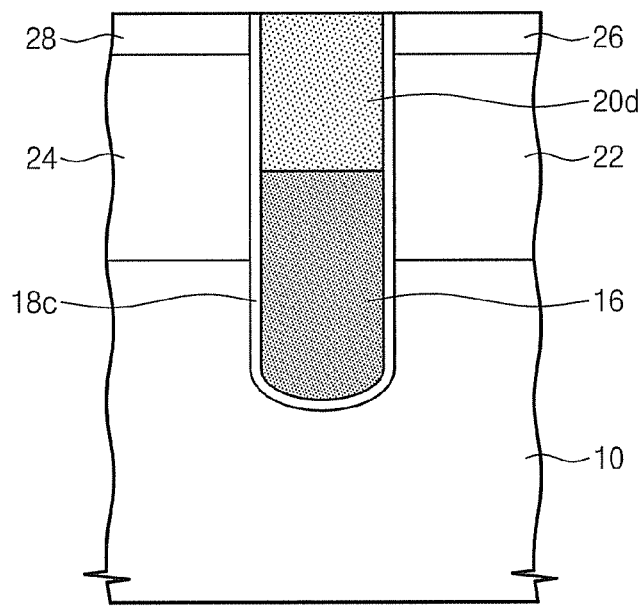

FIG. 7 is a sectional view illustrating a structure of a buried gate pattern according to yet another example embodiment of the inventive concepts.

Unlike FIG. 6, a capping layer pattern 20d of SiN may be disposed instead of the capping layer pattern 20a having a high-k material layer. Because the silicon nitride layer has a dielectric constant of more than about 3 and less than about 10, it is not a high-k material layer as defined by example embodiments of the inventive concepts. However, because of the gate insulation layer 18c is formed of the high-k material layer, a fringing effect may sufficiently occur when a gate voltage is applied. Because a silicon nitride layer without a relatively high dielectric constant is used, an electric field may decrease at the surface of the substrate 10, such that leakage current can be prevented.

Figure 8:
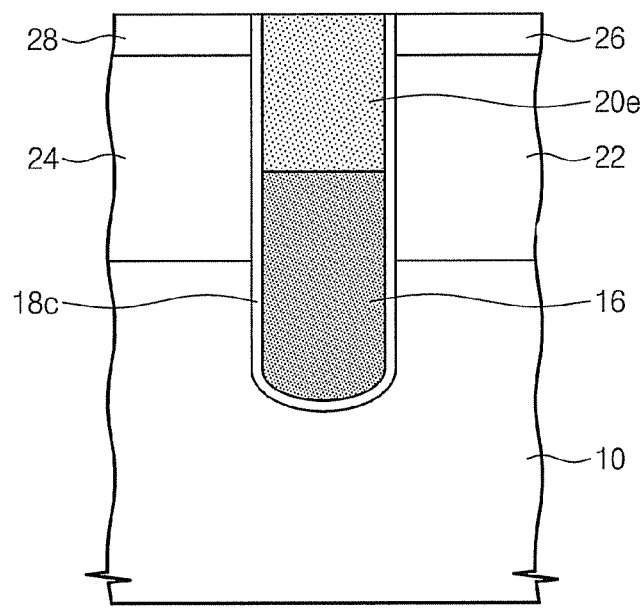

FIG. 8 is a sectional view illustrating a structure of a buried gate pattern according to a further example embodiment of the inventive concepts.

Unlike the embodiment of FIG. 7, a capping layer pattern 20e with a low-k material layer may be disposed. In this embodiment, due to the gate insulation layer 18c being formed of the high-k material layer, a fringing effect may be sufficient when a gate voltage is applied. Due to the low-k material layer, an electric field may be reduced at the surface of the substrate 10, such that leakage current can be prevented.

Figure 9:
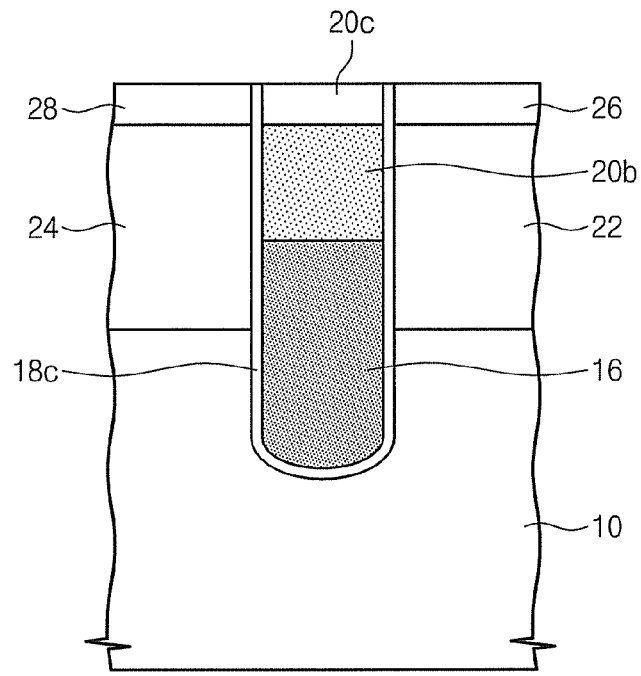

FIG. 9 is a sectional view illustrating a structure of a buried gate pattern according to still another example embodiment of the inventive concepts.

Unlike the embodiment of FIG. 6, a capping layer pattern on a buried gate electrode 16 may include a high-k material layer 20b and a low-k material layer 20c, which are sequentially stacked.

Even if the gate insulation layer 18c formed of the high-k material layer extends to the interface between the low-k material layer and the source/drain regions 22 and 24, an electric field at the surface of the substrate 10 may be reduced by the low-k material layer 20c, such that leakage current can be prevented.

Figure 10:
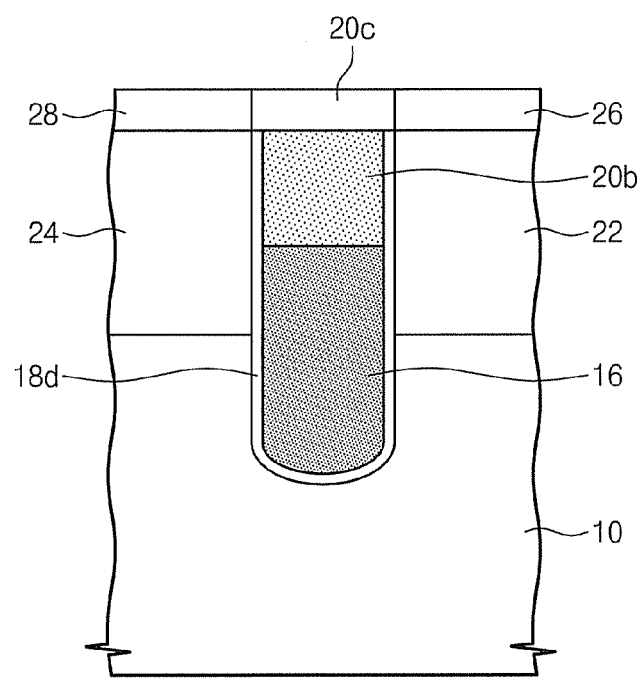

FIG. 10 is a sectional view illustrating a structure of a buried gate pattern according to a yet further example embodiment of the inventive concepts.

Unlike the embodiment of FIG. 9, a gate insulation layer 18d formed of a high-k material layer may not extend to the interface between the capping layer pattern 20c of the low-k material layer and the substrate 10. That is, according to this embodiment, the gate insulation layer 18d may cover the sidewalls and a lower surface of the buried gate electrode 16 and only the sidewalls of the capping layer pattern 20b of the high-k material layer. By doing this, an electric field at the surface of the substrate 10 may be reduced such that leakage current can be significantly prevented.

As another modified embodiment, the gate insulation layer 18d may be removed from the sidewalls of the capping layer pattern 20b of the high-k material layer.

Figure 11:
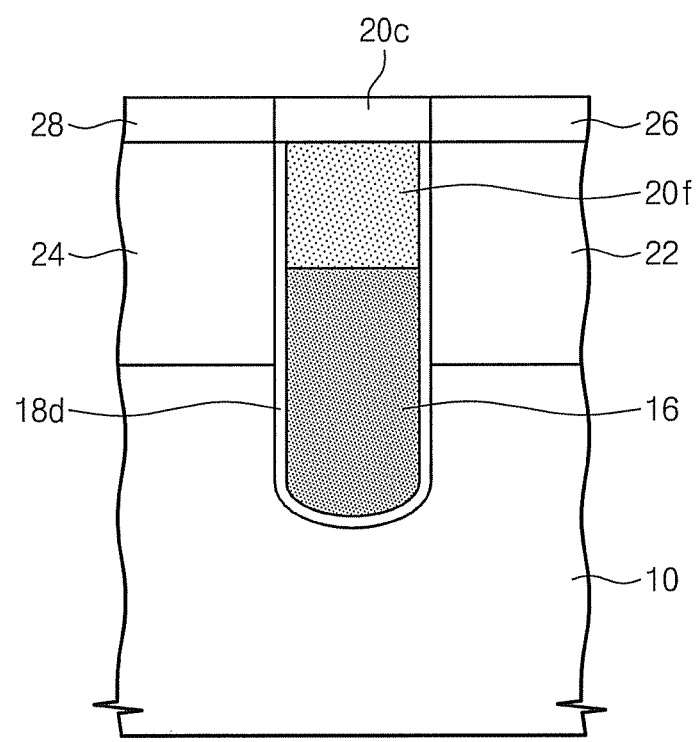

FIG. 11 is a sectional view illustrating a structure of a buried gate pattern according to yet still another example embodiment of the inventive concepts.

Unlike FIG. 10, a capping layer pattern 20f formed of a silicon nitride layer instead of the capping layer pattern 20b of the high-k material layer of FIG. 10 may be disposed. The capping layer pattern 20f may correspond to the bottom capping layer pattern, and the capping layer pattern 20c may correspond to the top capping layer pattern.

FIGS. 12A through 12F are sectional views illustrating a method of forming a semiconductor device with the buried gate pattern of FIG. 3 according to another example embodiment of the inventive concepts.

Figure 12A:
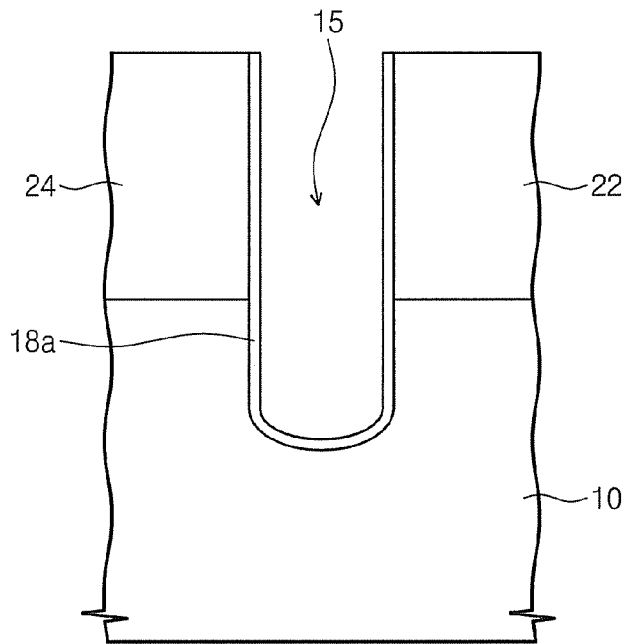
FIGS. 12A through 12G are sectional views illustrating a method of forming a semiconductor device of FIG. 3 according to another example embodiment.

Referring to FIG. 12A, as a typical method, after an impurity injection process and a channel impurity injection process for forming an impurity layer on a substrate 10 are performed, a gate trench 15 for providing a space that penetrates a region is formed. The gate trench 15 may divide the impurity layer into respectively a separated source region 22 and drain region 24. A gate insulation layer 18a may be formed along the inner wall of the gate trench 15. The gate insulation layer 18a may be removed from the upper surface of the substrate 10 (i.e., the upper surface of the source/drain regions 22 and 24).

Figure 12B:
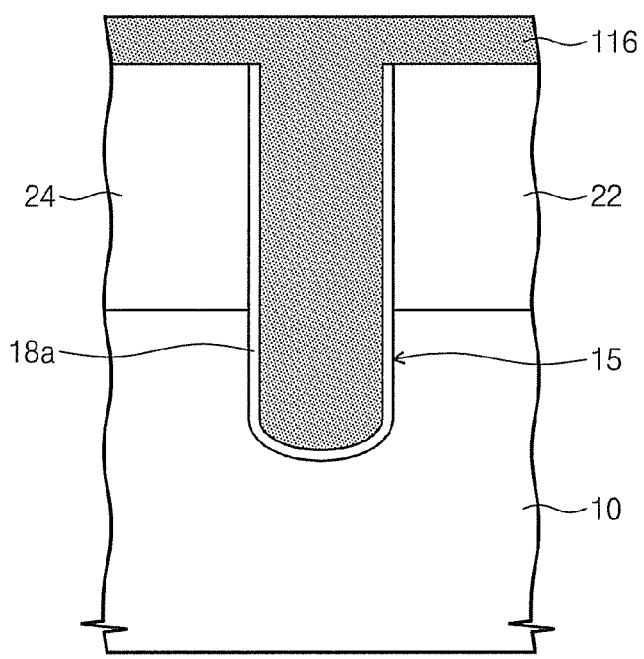
Figure 12C:
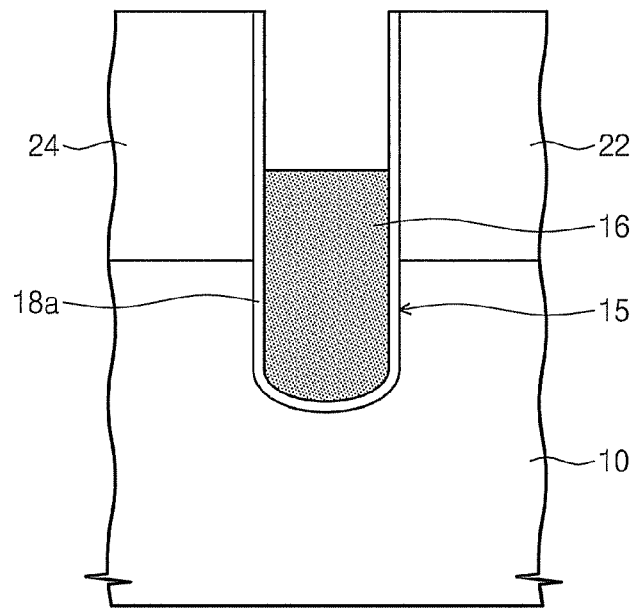

Referring to FIGS. 12B and 12C, after a conductive layer 116 for filling the inside of the trench 15 is formed on an entire surface of the substrate 10, it may be etched to partially remain in the trench 15, forming a buried gate electrode 116. In the embodiment, the upper surface of the gate electrode 16 may be formed higher than the lower surface of the source/drain regions 22 and 24 formed at both sides of the gate electrode 16. The conductive layer 116 may be formed of a metal (e.g., TiN) or polysilicon.

Figure 12D:
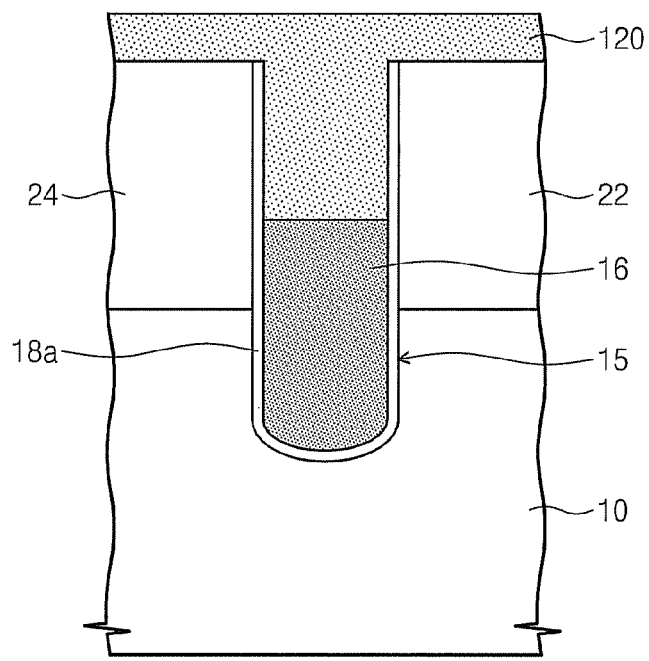

Referring to FIG. 12D, a high-k material layer 120 is filled in the trench 15 and is formed on the substrate 10. The high-k material layer 120 may include a metal (e.g., $ZrO_2$, $TaO_2$, $TiO_2$, or W), which has a dielectric constant of more than about 10.

Figure 12E:
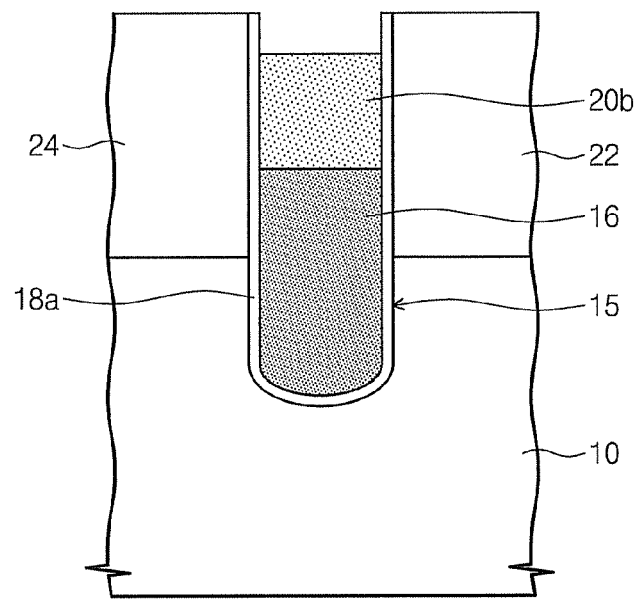

Referring to FIG. 12E, a capping layer pattern 20b may be formed by etching the high-k material layer 120 to partially remain in the trench 15.

Figure 12F:
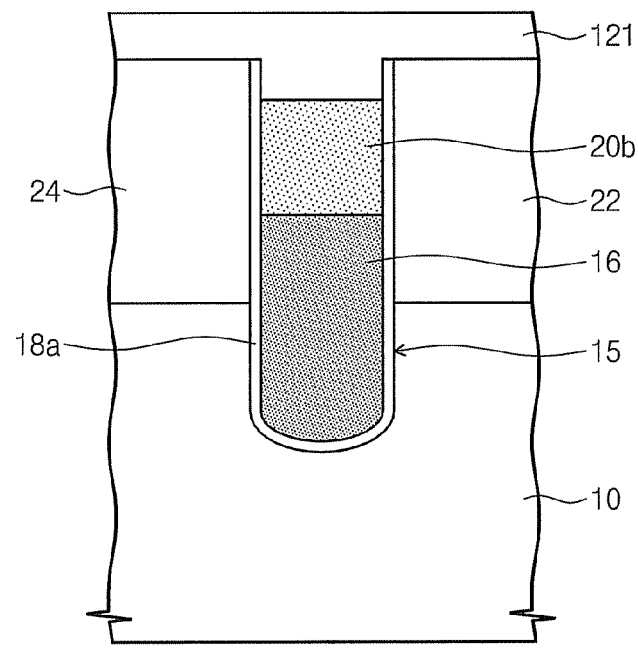

Referring to FIG. 12F, a low-k material layer 121 is filled in the trench 15 and may be formed on the substrate 10. The low-k material layer 121 may be an oxide layer.

Figure 12G:
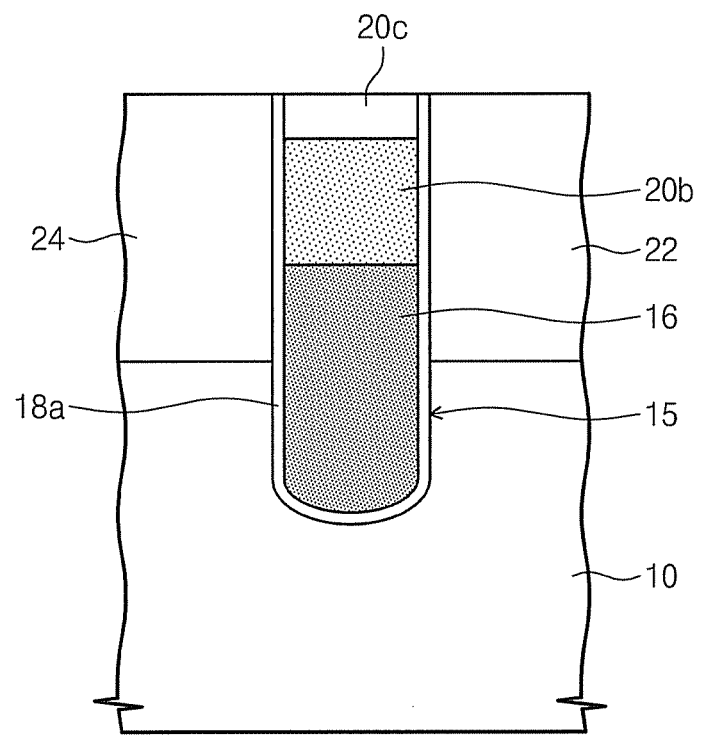

Referring to FIG. 12G, a capping layer pattern 20c may be formed by etching the low-k material layer 121 to expose the substrate surface (i.e., the upper surface of the source/drain regions 22 and 24). As a result, the buried gate electrode 16, the capping layer pattern 20b of the high-k material layer, and the capping layer pattern 20c of the low-k material layer may be sequentially stacked in the trench 15.

FIGS. 13A through 13D are sectional views illustrating a method of forming a semiconductor device with the buried gate pattern of FIG. 9 according to yet another example embodiment of the inventive concepts.

Figure 13A:
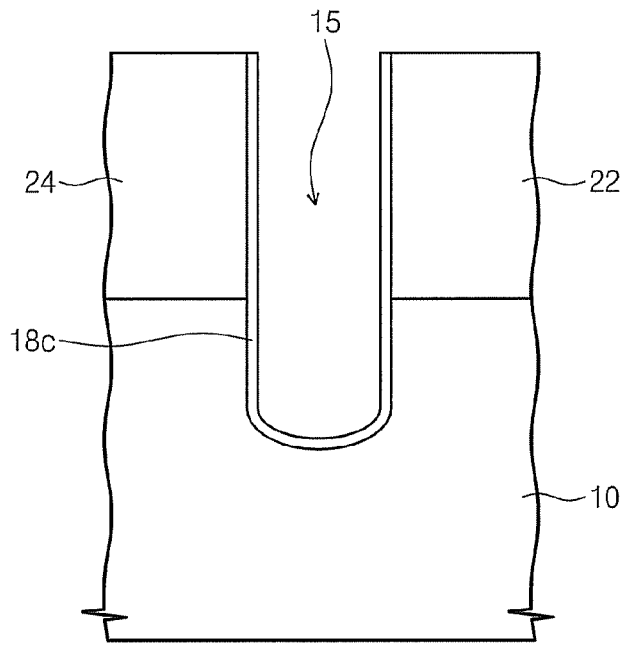
FIGS. 13A through 13D are sectional views illustrating a method of forming a semiconductor device of FIG. 9 according to yet another example embodiment.

Referring to FIG. 13A, as a typical method, after an impurity injection process and a channel impurity injection process for forming source/drain regions 22 and 24 on a substrate 10 are performed, a gate trench 15 may be formed in a region. A gate insulation layer 18c of a high-k material layer may be formed along the inner wall of the gate trench 15. The gate insulation layer 18e may be removed from the surface of the substrate 10 (i.e., the upper surface of the source/drain regions 22 and 24). The gate insulation layer 18c may include $ZrO_2$, $TaO_2$, or $TiO_2$.

Figure 13B:
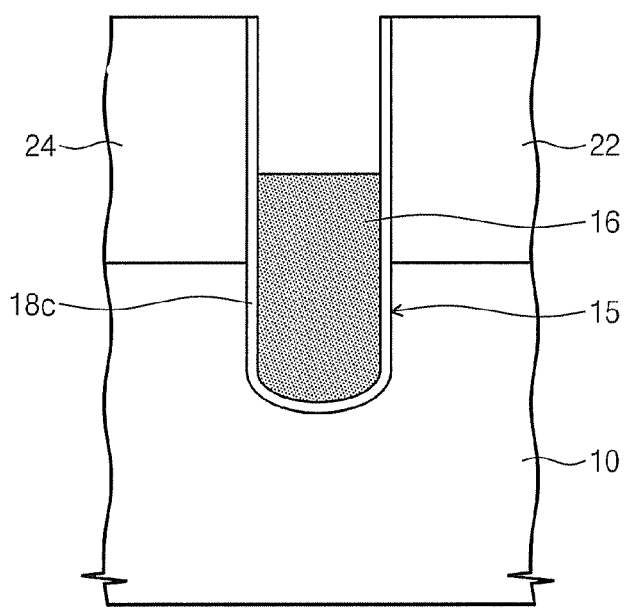

Referring to FIG. 13B, after a conductive layer for filling the inside of the trench 15 may be formed on an entire surface of the substrate 10, a buried gate electrode 16 may be formed by etching the conductive layer to remain in the trench 15. In the embodiment, the upper surface of the gate electrode 16 may be formed higher than the or lower surface of the source/drain regions 22 and 24 formed at both sides of the gate electrode 16. The conductive layer may be formed of a metal (e.g., TiN) or polysilicon.

Figure 13C:
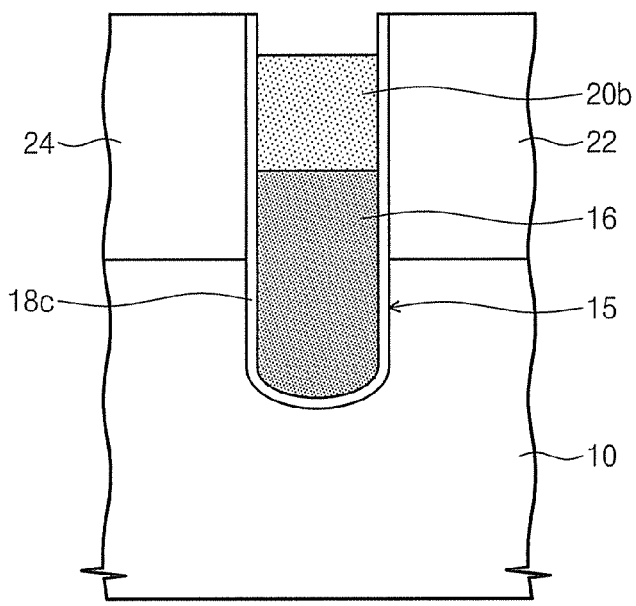

Referring to FIG. 13C, a high-k material may be filled in the trench 15 and may be formed on the substrate 10. The high-k material layer 10 may include a metal (e.g., $ZrO_2$, $TaO_2$, $TiO_2$, or W), which has a dielectric constant of more than about 10. Next, a capping layer pattern 20b may be formed by etching the high-k material layer to remain in the trench 15.

Figure 13D:
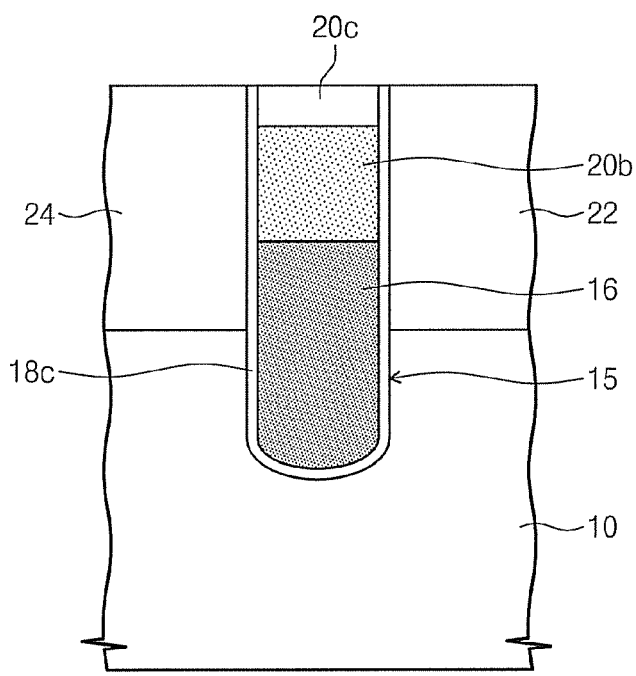

Referring to FIG. 13D, a low-k material may be filled in the trench and may be foamed on the substrate 10. The low-k material layer 121 may be an oxide layer. Next, a capping layer pattern 20c of a low-k material layer is formed by etching the low material layer to expose the substrate surface (i.e., the upper surface of the source/drain regions 22 and 24).

The above example embodiments related to the fog methods are not limited to the above-mentioned details and thus the for methods may be applied to embodiments of various kinds of gate pattern structures through diverse modifications. For example, the gate pattern structures of FIGS. 2A, 4, 5, 6, 7, 8, 10, and 11 may be formed based on the above-mentioned methods.

According to the example embodiments of the inventive concepts, a capping layer pattern of a high-k material layer is formed on a buried gate electrode. A fringing field caused by the high-k material layer extends an electron inversion, which is formed between the gate electrode and the substrate when a voltage is applied to the gate electrode (or, channel), into a lower region of source/drain regions in order to reduce resistance of the source/drain regions, such that the current attribute increases. In addition, by forming a low-k material layer on a high-k material layer, an electric field at a upper region of source/drain regions is reduced relatively, such that leakage current can be reduced.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concepts is to be determined by the broadest permissible interpretation of the following claims and their equivalents, and shall not be restricted or limited by the foregoing detailed description.

What is claimed is:
1. A semiconductor device, comprising:
a substrate having a gate trench;
a buried gate electrode partially filling the gate trench;
a capping layer pattern in the gate trench and over the buried gate electrode, the capping layer pattern including a first high-k material layer that directly contacts an upper surface of the buried gate electrode;
a low-k material layer stacked over the first high-k material layer of the capping layer pattern;

source/drain regions below an upper surface of the substrate and adjacent to both sides of the buried gate electrode; and
a gate insulation layer interposed between the gate trench and the buried gate electrode and the low-k material layer and the source/drain regions.

2. The semiconductor device of claim 1, wherein the first high-k material layer has a dielectric constant of more than 10, and the low-k material layer has a dielectric constant of less than 3.

3. The semiconductor device of claim 1, further comprising:
a high concentration impurity layer in an upper region of the source/drain regions.

4. The semiconductor device of claim 1, wherein the gate insulation layer includes a second high-k material layer with a dielectric constant of more than 10.

5. The semiconductor device of claim 1, wherein,
the source/drain regions extend from the upper surface of the substrate, and
bottom surfaces of the source/drain regions are lower than the upper surface of the buried gate electrode.

6. The semiconductor device of claim 1, wherein the gate insulation layer comprises a second high-k material layer with a dielectric constant of more than 10 and is interposed between the first high-k material layer and the source/drain regions.

7. A dynamic random access memory (DRAM), comprising:
an impurity layer in a substrate;
a gate trench in the impurity layer and dividing the impurity layer into respectively separated source/drain regions;
a buried gate electrode partially filling the gate trench;
a capping layer pattern in the gate trench and over the buried gate electrode, the capping layer pattern including,
a bottom capping layer pattern and a top capping layer pattern, which are sequentially stacked,
the bottom capping layer pattern including a first high-k material with a dielectric constant of more than 10, and
the top capping layer pattern including a low-k material with a dielectric constant of less than 3;
an interlayer insulation layer covering the capping layer pattern and the source/drain regions; and
a storage electrode over the interlayer insulation layer and electrically connected to one of the source/drain regions.

8. The DRAM of claim 7, further comprising:
a gate insulation layer interposed between an inner wall of the gate trench and the buried gate electrode.

9. The DRAM of claim 8, wherein the gate insulation layer is interposed between the capping layer pattern and the source/drain regions.

10. The DRAM of claim 9, wherein the gate insulation layer comprises a second high-k material layer with a dielectric constant of more than 10.

11. The DRAM of claim 7, wherein an interface between the capping layer pattern and the buried gate electrode is lower than upper surfaces of the source/drain regions and higher than lower surfaces of the source/drain regions.

12. The DRAM of claim 7, further comprising high concentration impurity layers in upper regions of the source/drain regions, wherein the high concentration impurity layers have a higher impurity concentration than the source/drain regions.

13. A semiconductor device, comprising:
a buried channel array transistor (BCAT) formed within a substrate, the BCAT comprising,
a gate electrode,
a capping layer pattern over the gate electrode, the capping layer pattern including,
a lower layer and an upper layer,
the lower layer including a material with a dielectric constant of 10 or more, and
the upper layer including a material with a dielectric constant of 3 or less,
source/drain regions adjacent to sidewalls of the gate electrode, upper surfaces of the upper layer and of the source/drain regions being at the same height, and
a gate insulation layer interposed between the substrate and the gate electrode.

14. The semiconductor device of claim 13, wherein the gate insulation layer is further interposed between the upper layer and the source/drain regions.

15. The semiconductor device of claim 13, wherein the capping layer pattern and the gate insulation layer include the material having a dielectric constant of 10 or more.

* * * * *